United States Patent
Jayaraman

(10) Patent No.: US 7,423,096 B2
(45) Date of Patent: Sep. 9, 2008

(54) UNDERFILL OF RESIN AND SULFONIC ACID-RELEASING THERMALLY CLEAVABLE COMPOUND

(75) Inventor: Saikumar Jayaraman, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 407 days.

(21) Appl. No.: 10/954,651

(22) Filed: Sep. 29, 2004

(65) Prior Publication Data

US 2006/0073344 A1    Apr. 6, 2006

(51) Int. Cl.
*C08L 63/00* (2006.01)
*C08L 63/02* (2006.01)

(52) U.S. Cl. .................... 525/481; 525/109; 525/113; 525/114; 525/486; 525/523; 525/524; 525/529; 525/530; 525/533

(58) Field of Classification Search .............. None
See application file for complete search history.

(56) References Cited

U.S. PATENT DOCUMENTS

| | | | | |
|---|---|---|---|---|
| 3,654,241 A | * | 4/1972 | Doughty et al. | 528/375 |
| 4,439,517 A | * | 3/1984 | Irving | 430/328 |
| 4,971,726 A | * | 11/1990 | Maeno et al. | 252/511 |
| 5,217,649 A | * | 6/1993 | Kulkarni et al. | 252/500 |
| 6,020,427 A | * | 2/2000 | Abraham et al. | 525/67 |
| 6,376,037 B1 | * | 4/2002 | Montanari et al. | 428/36.9 |
| 6,858,371 B2 | * | 2/2005 | Lee et al. | 430/270.1 |

FOREIGN PATENT DOCUMENTS

| | | | |
|---|---|---|---|
| DE | 3934428 A1 | * | 4/1991 |
| JP | 60-173047 A | * | 9/1985 |
| JP | 5-25256 A | * | 2/1993 |
| JP | 5-230310 A | * | 9/1993 |

OTHER PUBLICATIONS

Chemical abstracts registry No. 41580-58-9 for N-trifluoromethylsulfonyloxy)phthalimide, Jan. 16, 2003, one page.*
Brunsvold, W., et al., "Non-metallic acid generators for i-line & g-line chemicaly amplified resists", *SPIE, 1466, Advances in Resist Technology & Processing VIII*, (1991),368-377.
Pawlowski, G., et al., "Chemically amplified DUV photoresists using a new class of photoacid generating compounds", *SPIE, 1262, Advances in Resist Technology & Processing VII*, (1990),16-25.
Prakash, Anna, et al., "Solder Flux Composition", U.S. Appl. No. 11/444,738 filed May 31, 2006.
Shirai, M. et al., "Novel photocrosslinkable polymers with pendant imino sulfonate groups", *Journal of Polymer Science, Part C: Polymer Letters*, (1986),119-124.

* cited by examiner

*Primary Examiner*—Robert Sellers
(74) *Attorney, Agent, or Firm*—John N. Greaves

(57) ABSTRACT

An underfill composition includes a thermosetting resin and a thermally cleavable component that releases sulfonic acid upon thermal activation. The underfill composition is applied to flip-chip technology during no-flow underfill mounting of the flip-chip to a mounting substrate. The mounting substrate can be further mounted on a board. A process includes formation of the underfill composition. A method includes assembly of the underfill composition with the flip-chip, and further can include assembly of the mounting substrate to a board. A computing system is also included that uses the underfill composition.

4 Claims, 5 Drawing Sheets

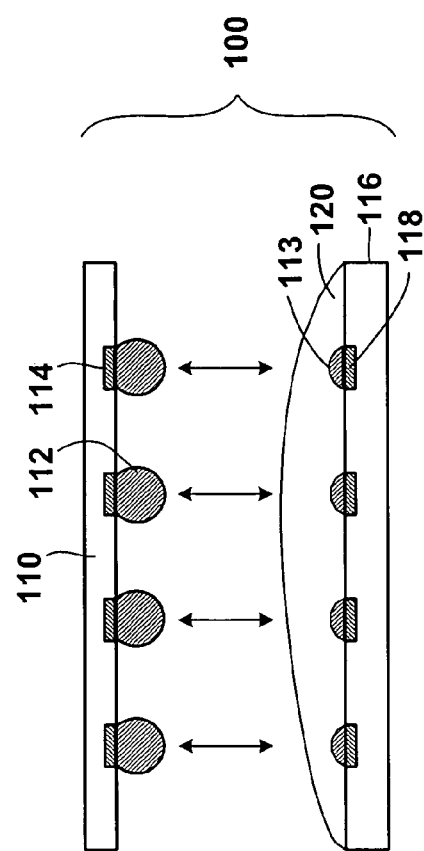
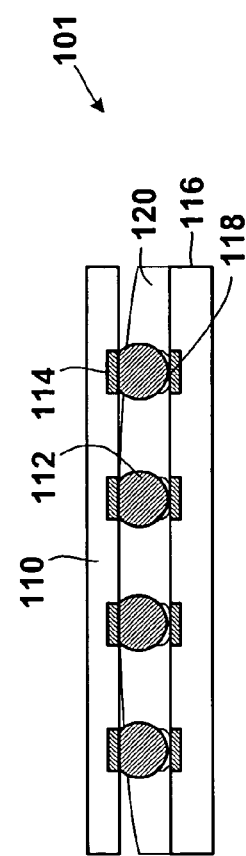
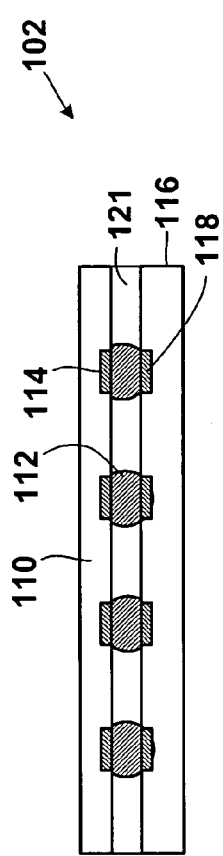
FIG. 1A
FIG. 1B
FIG. 1C

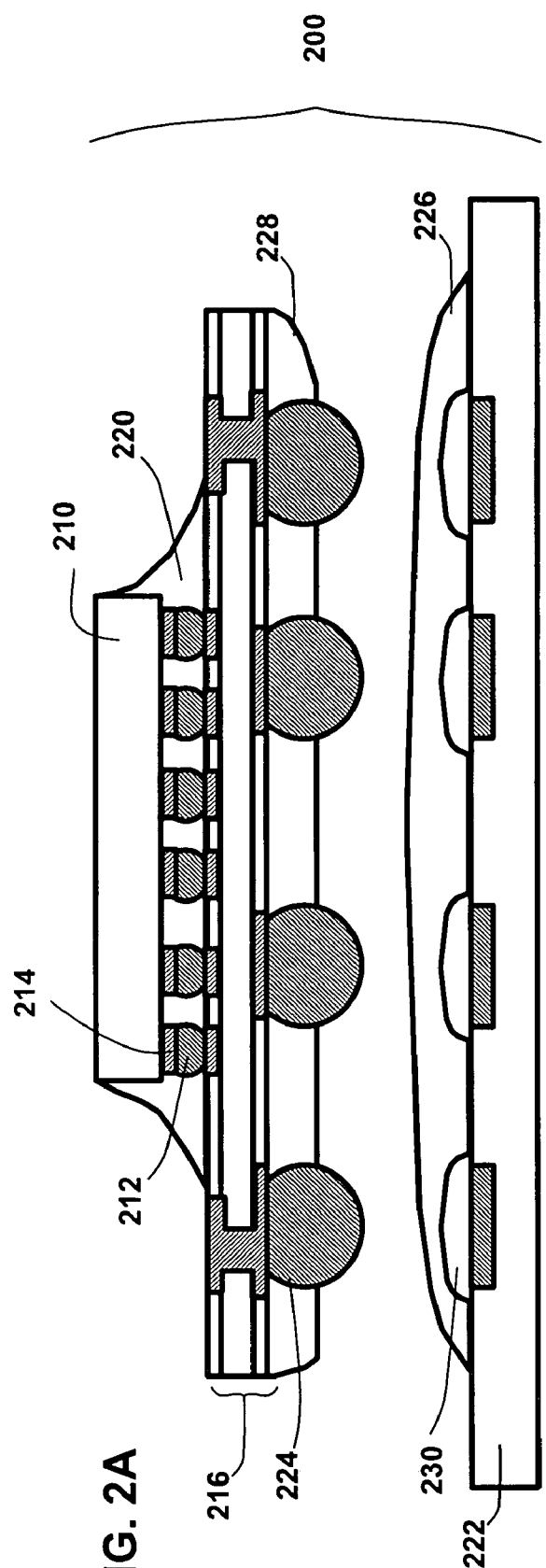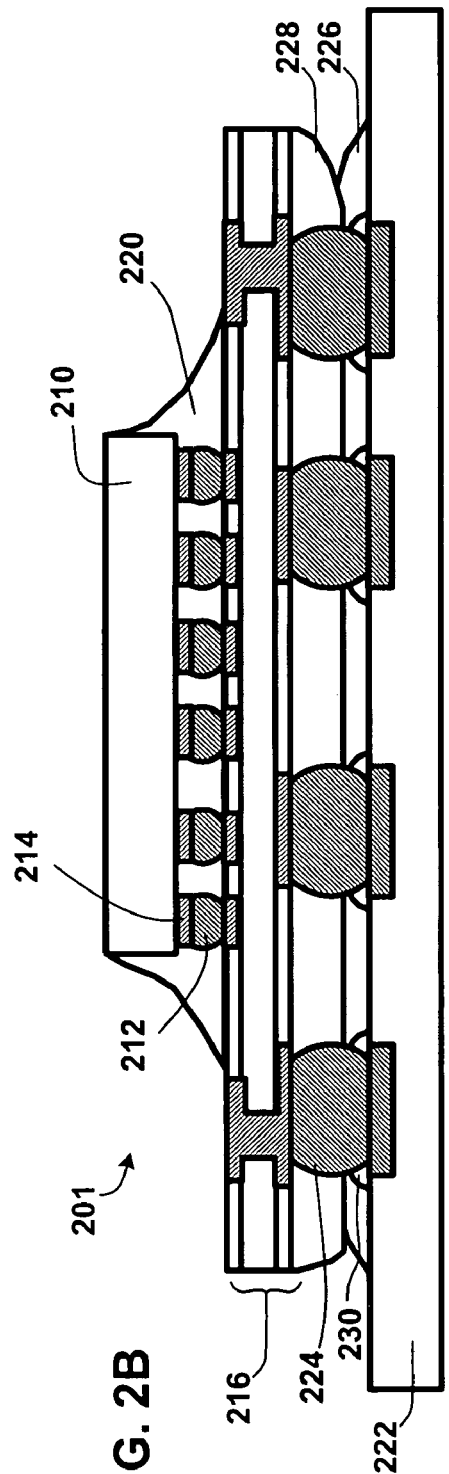

UNDERFILL OF RESIN AND SULFONIC ACID-RELEASING THERMALLY CLEAVABLE COMPOUND

TECHNICAL FIELD

Disclosed embodiments relate to fluxes that are thermally activatable and that have relatively low vapor pressures at elevated temperatures.

BACKGROUND INFORMATION

Epoxy-based underfill compositions are used frequently for no-flow underfill processes. Some epoxy-based underfill compositions use anhydrides or phenols as hardeners, and also use acidic compounds such as tartaric acids and/or oxalic acids as fluxing compounds. In the case of anhydrides, alcohol is added to hydrolyze the anhydride to in situ liberate the acid in the underfill composition. Underfill compositions can also contain dielectric fillers for reduction of the coefficient of thermal expansion (CTE). Underfill compositions also use additives as elastomers for stress reduction, coupling agents for adhesion promotion, and catalysts for activating the cure.

During processing, acid interacts with interconnect metallurgy to dissolve oxides on electrical contact surfaces to provide an interconnection path for wetting between the bond pad on a substrate and an electrical bump such as on a die. One electronic device includes a flip-chip and mounting substrate, among other things. One characteristic of flip-chip technology is shear stress on the solder joints during temperature cycling of the device. This shear stress is partially a result of a difference in the CTEs of the flip-chip and the mounting substrate. Die materials such as silicon, germanium, and gallium arsenide, along with their packaging materials, may have CTEs in a range from about 3 ppm/° C. to about 6 ppm/° C. Mounting substrates are usually composites of organic-impregnated fiberglass dielectrics and metallic circuitry. These substrates may have CTEs in a range from about 15 ppm/° C. to about 25 ppm/° C. Consequently, a mismatch in the CTEs exists between the flip-chip and the mounting substrate.

Solder joints are reinforced by filling the space between the flip-chip and the mounting substrate, and around the solder joints, with the underfill composition. The two main processes that are commonly used to underfill the flip-chip include the capillary underfill process and the no-flow underfill process.

A capillary underfill process typically proceeds by first aligning the solder bumps on a flip-chip with the pads on a substrate, and the solder is reflowed to form the solder joints. After forming the interconnect, the underfill is flowed between the flip-chip and the mounting substrate. Thereafter, the underfill composition is cured. Capillary underfilling can be assisted by pumping the underfill composition between the flip-chip and the mounting substrate, or by vacuum-assisted drawing the underfill composition between the flip-chip and the mounting substrate.

The effectiveness of an underfill composition depends on its chemical, physical, and mechanical properties. Properties that make an underfill composition desirable include low CTE, low moisture uptake, high adhesion, high toughness, high glass transition (Tg) temperature, high heat distortion temperature, and others. The underfill composition includes particulate filler inorganics such as silica or the like, and metal flakes or the like. The particulate filler increases the modulus and acts as a CTE intermediary for the mismatched CTEs of the flip-chip and the mounting substrate. An example of a silica-filled composition is silica-filled, epoxy-based organics.

The no-flow underfill process is another method of underfilling a flip-chip. In a no-flow underfill process, the underfill composition is dispensed on the mounting substrate or the flip-chip, and the flip-chip and the mounting substrate are brought into contact. The solder bumps on the chip and the pads on the substrate are aligned. Next, the underfill composition is cured prior to or substantially simultaneously with reflowing the solder to create the solder joints.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 1A is a cross-section of a package during a no-flow underfill process according to an embodiment;

FIG. 1B is a cross-section of the package depicted in FIG. 1A after further processing;

FIG. 1C is a cross-section of the package depicted in FIG. 1B after further processing;

FIG. 2A is a cross-section of a package during processing according to an embodiment;

FIG. 2B is a cross-section of the package depicted in FIG. 2A after further processing according to an embodiment;

DETAILED DESCRIPTION

Figure 1D:
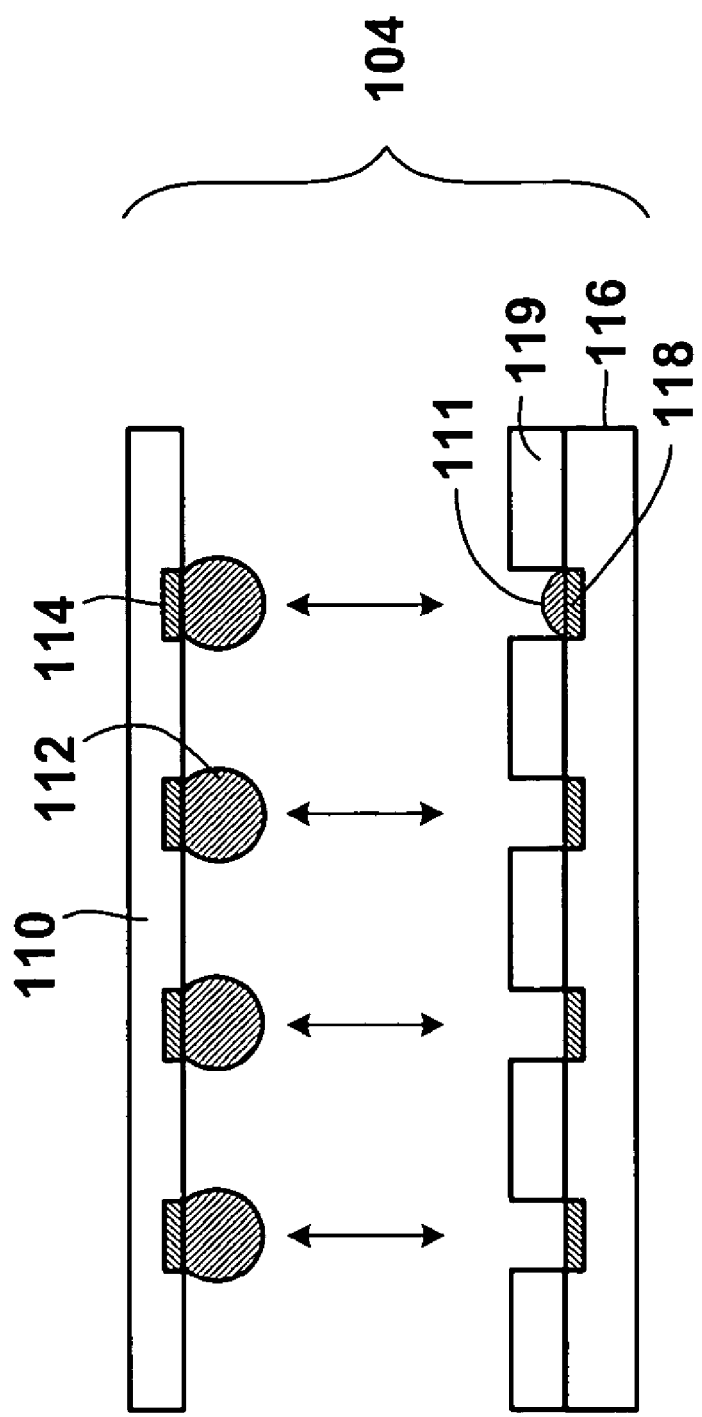
FIG. 1D is a cross-section of a package during a no-flow underfill process according to an embodiment.

The following description includes terms, such as upper, lower, first, second, etc., that are used for descriptive purposes only and are not to be construed as limiting. The embodiments of a device or article described herein can be manufactured, used, or shipped in a number of positions and orientations.

The terms "die" and "processor" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials.

A board is typically a resin-impregnated fiberglass structure that acts as a mounting substrate for the die. A board can be prepared with a bond pad, also referred to as a bond finger, that is flush with the board, or the bond pad can be set upon the board surface. As depicted in this disclosure, a bond pad is not limited to being flush or being set upon the surface only because it is illustrated as such, unless it is explicitly stated in the text.

A "solder bump" or "electrical bump" is understood to be a unit of electrically conductive material such as a tin-lead solder, a tin-indium solder, a tin-bismuth solder, a tin-silver solder, or other solders that are used in the microelectronic arts. The terms "solder bump" and "electrical bump" can be used interchangeably. Additionally, other electrical communication structures can be used, such as a pin in a pin-grid array.

A fluxing thermosetting resin underfill composition includes a thermally cleavable compound that releases sulfonic acid, a thermosetting resin, and the solution, reaction, and mixture products thereof. This also pertains to residues of the sulfonic acid-releasing compounds. For example, where substantially all sulfonic acid has been released and has reacted with metal oxides, the residues are identifiable such as oxides of sulfur and reduced metal solders. The process of forming an underfill composition on a substrate includes releasing the sulfonic acid from the underfill mixture by thermal activation.

FIG. 1A is a cross-section of a package 100 during a no-flow underfill process according to an embodiment. The package 100 includes a flip-chip 110 and a solder bump 112 that is attached to the flip-chip 110. Electrical coupling for the flip-chip 110 is accomplished through a die bond pad 114 that is disposed on the flip-chip 110.

In an embodiment, a mounting substrate 116 is included. The mounting substrate 116 is part of a printed wiring board (PWB) such as a main board. In an embodiment, the mounting substrate 116 is part of an interposer. In an embodiment, the mounting substrate 116 is part of a mezzanine PWB. In an embodiment, the mounting substrate 116 is part of an expansion card PWB. In an embodiment, the mounting substrate 116 is part of a small PWB such as a board for a handheld device such as a cell phone or a personal digital assistant (PDA).

The mounting substrate 116 is also brought near the flip-chip 110 as indicated by the directional arrows therebetween. The mounting substrate 116 includes a substrate bond pad 118 for electrical communication with the flip-chip 110. The mounting substrate 116 is covered with a no-flow underfill composition 120. In an embodiment, the mounting substrate 116 is prepared with a mounting substrate solder bump 111, which is disposed upon the mounting substrate 116 before the deposition of the no-flow underfill composition 120. In an embodiment, the no-flow underfill composition 120 is alternatively deposited upon the flip-chip 110 instead of on the mounting substrate 116. The underfill composition 120 has unique formulations, according to various embodiments, and will be described below in greater detail.

A method of assembling the package 100 includes bringing the flip-chip 110 and the mounting substrate 116 together after depositing the no-flow underfill composition 120 on either or both of the flip-chip 110 or the mounting substrate 116.

FIG. 1B is a cross-section of the package depicted in FIG. 1A after further processing. The package 101 is depicted during assembly. The solder bump 112 is depicted as being forced through the no-flow underfill composition 120 in anticipation of making electrical contact with the substrate bond pad 118. The solder bump 112 penetrates the no-flow underfill composition 120. The no-flow underfill composition 120 is not pre-gelled. This allows particulate fillers to flow laterally away from the substrate bond pad 118. This also allows the no-flow underfill composition 120 is completely penetrated by the solder bump 112. In the first instance, the particulate fillers would prevent a useful contact between the solder bump 112 and the substrate bond pad 118. In the second instance, the pre-gelled no-flow underfill composition 120 would also prevent a useful contact between the solder bump 112 and the substrate bond pad 118.

In an embodiment, the particulate filler is present from a trace amount, up to about 75% of the total weight of the underfill composite. In an embodiment, the particulate filler is present in a range from about 30% to about 70% of the total weight of the underfill composite. In an embodiment, the particulate filler is present in a range from about 45% to about 55% of the total weight of the underfill composite.

FIG. 1C is a cross-section of the package depicted in FIG. 1B after further processing. The package 102 is depicted after full contact between the solder bump 112 and the substrate bond pad 118. In an embodiment, the solder bump 112 is reflowed by heating the package 102. During heating, sulfonic acid-containing compositions in the no-flow underfill composition 120 begin to release their acids, while the no-flow underfill composition 120 begins to soften and to flow. In an embodiment, reflow of the solder bump 112 is accomplished before complete curing of the no-flow underfill composition 120. In an embodiment, the no-flow underfill composition 120 is B-staged as is known in the art, and complete curing is delayed in accordance with more effective use of the thermal budget of the package 102 with further back-end-of-line (BEOL) packaging processing. Accordingly, the no-flow underfill composition 120 (FIG. 1B) is depicted as item 121 (FIG. 1C) to distinguish it as a completely cured no-flow underfill with residues according to an embodiment as set forth herein.

The package 102 is depicted after a curing process has been carried out. In an embodiment, the curing process is carried out according to specific methods. In an embodiment, curing is followed by reflowing of the solder bump 112 onto the substrate bond pad 118. In an embodiment, curing and reflowing are carried out substantially simultaneously. In an embodiment, curing is carried out by various processing paths including autocatalytic, additive catalytic, diluent cross-linking/hardening, thermoset, and combinations thereof.

In an embodiment, curing the underfill composition 121 is cured by an autocatalytic process. The autocatalytic process is carried out in an embodiment by providing a reactive diluent in the underfill composition 121. In an embodiment, the curing process is carried out by an additive catalytic curing process. The additive catalytic curing process includes an additive such as a metal catalyst powder that causes the underfill composition 121 to cure. In an embodiment, a cross-linking/hardening process is carried out to cure the underfill composition 121. Examples of specific cross-linker/hardener composition are set forth herein. In an embodiment, a thermoset curing process is carried out. Typically, several curing process embodiments are assisted by thermal treatment. However, in some embodiments, such as the use of an epoxy alone, thermoset processing may be done without other curing agent processes.

In an embodiment, the sulfonic acid-releasing compound has a $Pk_A$ of the acid (measure of acid strength) of less than 3. In an embodiment a di-acid is used instead of or in addition to a mono acid. The di-acid has the ability has a higher boiling point, as well as a stronger fluxing effect.

Sulfonic acids ($R-SO_3H$) are "isoesters" of carboxylic acids. One of the primary candidates of such sulfonic acid precursors are sulfonamides. Sulfonamides can be considered to be acid analogs in which the carbonyl moiety is replaced by $SO_2$ group and the hydroxy group is replaced by nitrogen group. Because they contain a nitrogen atom, sulfonamides can be classified as primary, secondary or tertiary depending on the degree of substitution of the sulfonamide nitrogen. Primary sulfonamides have two hydrogen atoms, while secondary sulfonamides have only one hydrogen atom.

It is these hydrogen atoms that make sulfonamides acidic in nature, due to resonance and stabilization of the charge. But sulfonamides are less acidic than carboxylic acids due to the presence of electron donor nitrogen atoms, and do not hydrogen bond as carboxylic acids, due to steric hindrance. This makes them free acids. The non hydrogen bonding ability makes them useful to be formulated with amine hardeners. This provides valuable working life for the fluxes. Also due to the sulfur nitrogen bond, the thermal stability of the sulfonamides are higher but the sulfonamides do thermally break to form in situ sulfonic acids at temperatures at or above about 150° C. The volatility of sulfonic acids are also lower, thus less volatalization occurs, which results in lower voids in underfill composition.

Sulfonamides, cannot only be activated thermally, but with the addition of a base such as tertiary amines, they release acidic hydrogen atoms, forming strong acids for reactions. Fluxes that can be activated at lower temperatures, such as from about 100° C. to about 300° C. are therefore useful.

FIG. 1D is a cross-section of a package 104 during a no-flow underfill process according to an embodiment. The package 104 includes the flip-chip 110 and the solder bump 112 that is attached to the flip-chip 110. Electrical coupling for the flip-chip 110 is accomplished through a die bond pad 114 that is disposed on the flip-chip 110.

A mounting substrate 116 is included. The mounting substrate 116 is prepared by forming a mounting substrate solder bump 111. In an embodiment, the mounting substrate solder bump 111 is first formed on the mounting substrate 116 by a process such as screen printing. Thereafter, the mounting substrate 116 is further prepared with a no-flow underfill composition 119, which is patterned such as by screen printing. In an embodiment, the no-flow underfill composition 119 is patterned by virtue of non-wetting qualities with respect to the mounting substrate solder bump 111, but with wetting qualities with respect to the mounting substrate 116.

The mounting substrate 116 is also brought near the flip-chip 110 as indicated by the directional arrows therebetween. The mounting substrate 116 includes a substrate bond pad 118 for electrical communication with the flip-chip 110. The mounting substrate 116 is covered with a no-flow underfill composition 119. In an embodiment, the mounting substrate 116 is prepared with a mounting substrate solder bump 111, which is disposed upon the mounting substrate 116 before the deposition of the no-flow underfill composition 119. In an embodiment, the no-flow underfill composition 119 is alternatively deposited upon the flip-chip 110 instead of on the mounting substrate 116. The underfill composition 119 has unique formulations, according to various embodiments, and will be described below in greater detail.

A method of assembling the package 100 includes bringing the flip-chip 110 and the mounting substrate 116 together after depositing the no-flow underfill composition 120 on either or both of the flip-chip 110 or the mounting substrate 116.

Underfill Compositions

In an embodiment, the underfill composition includes a thermally cleavable compound that releases sulfonic acid or the like, and a thermosetting resin, and the solution, reaction, and mixture products thereof including residue. In an embodiment the thermally cleavable compound is capable of generating the sulfonic acid from about 1% to about 20% by weight of the total underfill composition when it is prepared.

In an embodiment, the thermosetting resin includes an epoxy. In an embodiment, the thermosetting resin includes an epoxy and at least one of a hardener, an anhydride, a phenolic, and an amine, and the solution, reaction, and mixture products thereof.

In an embodiment, the thermosetting resin includes an epoxy and at least one of a co-curing compound selected from a maleamide, a cyanate ester, and a vinyl ether, and the solution, reaction, and mixture products thereof.

In an embodiment, the thermosetting resin includes a maleamide. In an embodiment, the thermosetting resin includes a cyanate ester. In an embodiment, the thermosetting resin includes an ethynyl. In an embodiment, the thermosetting resin includes a vinyl, and the solution, reaction, and mixture products thereof.

Sulfonic Acid-Releasing Constituents

In an embodiment, the sulfonic acid-releasing constituent includes the compound:

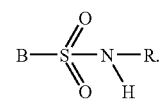

(1)

In an embodiment, item B includes an unsubstituted aromatic. In an embodiment, item B includes a substituted aromatic.

In an embodiment the R functional group includes an aromatic. In an embodiment, the R functional group includes a substituted aromatic. In an embodiment, the R functional group includes an aliphatic. In an embodiment, the R functional group includes a substituted aliphatic. In an embodiment, the R functional group includes a cycloaliphatic. In an embodiment, the R functional group includes a substituted cycloaliphatic. In an embodiment, the R functional group includes a fluoroalkyl. In an embodiment, the R functional group includes a fluoroaromatic. In an embodiment, item B and the R functional group are any combination of two of the above.

In an embodiment, the sulfonic acid-releasing constituent includes the compound:

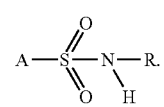

(2)

In an embodiment, item A includes an unsubstituted cyclohexyl. In an embodiment, the item A includes a substituted cyclohexyl. In an embodiment, item A includes an unsubstituted cycloaliphatic. In an embodiment, item A includes a substituted cycloaliphatic. In an embodiment, item A is replaced by an aliphatic.

In an embodiment, the R functional group includes an aromatic. In an embodiment, the R functional group includes a substituted aromatic. In an embodiment, the R functional group includes an aliphatic. In an embodiment, the R functional group includes a substituted aliphatic. In an embodiment, the R functional group includes a fluoroalkyl. In an embodiment, the R functional group includes a fluoroaromatic. In an embodiment, item A and the R functional group are any combination of two of the above.

In an embodiment, the sulfonic acid-releasing constituent includes the compound:

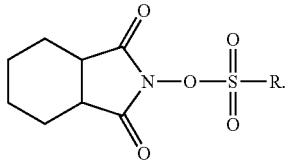

(3)

In an embodiment, the given cycloaliphatic includes an unsubstituted cyclohexyl. In an embodiment, the given cycloaliphatic includes a substituted cyclohexyl. In an embodiment, the given cycloaliphatic includes an unsubstituted cycloaliphatic. In an embodiment, the given cycloaliphatic includes a substituted cycloaliphatic.

In an embodiment, the R functional group includes an aromatic. In an embodiment, the R functional group includes a substituted aromatic. In an embodiment, the R functional group includes an aliphatic. In an embodiment, the R functional group includes a substituted aliphatic. In an embodiment, the R functional group includes a fluoroalkyl. In an embodiment, the R functional group includes a fluoroaromatic. In an embodiment, the given aliphatic and the R functional group are any combination of two of the above.

In an embodiment, the sulfonic acid-releasing constituent includes the compound:

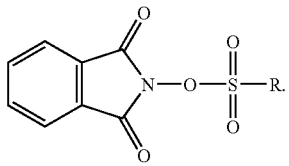

(4)

In an embodiment, the given aromatic includes an unsubstituted aromatic. In an embodiment, the given aromatic includes a substituted aromatic.

In an embodiment, the R functional group includes an aromatic. In an embodiment, the R functional group includes a substituted aromatic. In an embodiment, the R functional group includes an aliphatic. In an embodiment, the R functional group includes a substituted aliphatic. In an embodiment, the R functional group includes a cycloaliphatic. In an embodiment, the R functional group includes a substituted cycloaliphatic. In an embodiment, the R functional group includes a fluoroalkyl. In an embodiment, the R functional group includes a fluoroaromatic.

In an embodiment, the sulfonic acid-releasing constituent includes the compound:

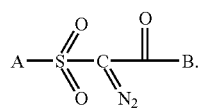

(5)

In an embodiment, either of both of items A and B are an unsubstituted aromatic. In an embodiment, either of both of items A and B are substituted aromatics. In an embodiment, only one of item A and item B is a substituted aromatic. In an embodiment, one of item A and item B is replaced by an aliphatic. In an embodiment, both of items A and B are replaced by aliphatics. In an embodiment, an aliphatic that replaced either of both of items A and B includes an unsubstituted cycloaliphatic. In an embodiment, an aliphatic that replaced at least one aromatic includes a substituted cycloaliphatic. In an embodiment, an aliphatic that replaced one or both of items A and B aromatic includes a fluroalkyl. In an embodiment, an aliphatic that replaced one or both of items A and B includes a fluoroaromatic. In an embodiment, any two of the above unsubstituted, substituted, given aromatics, and aliphatics are provided.

Qualities of the sulfonic acid-releasing compound can include a low vapor pressure during thermal curing. By "low vapor pressure during thermal curing", it is intended to mean that volatilization of any part of the underfill composition is minimal such that voids formed are minimized during thermal curing. In an embodiment, thermal curing is carried out in a range from about 100° C. to about 300° C. In an embodiment, the formation of voids at about 100° C. is negligible when viewed with a typical stereo optical microscope. In an embodiment, the formation of voids at about 300° C. is less than about 5% when viewed with a scanning electron microscope (SEM). In an embodiment, thermal curing is carried out in a temperature range from about 125° C. to about 200° C. In an embodiment, thermal curing is carried out at about 150° C. In an embodiment, the formation of voids at about 150° C. is less than about 1% when viewed with an SEM.

Additive Materials

In an embodiment, additive materials are included with the underfill compositions. The additive materials and the underfill compositions constitute "underfill mixtures" according to embodiments set forth herein.

In an embodiment, one additive material is an elastomer for imparting flexibility to the principal underfill composition.

In an embodiment, an additive material is a hardener/crosslinker. The specific hardener/crosslinker that is employed will depend upon compatibility with the underfill composition. Hardeners/crosslinkers can be both aromatic and aliphatic in nature. The hardener/crosslinker in one embodiment is an anhydride composition. Some suitable anhydride hardeners include nadic anhydride, methyl cyclohexy anhydride, pthalic anhydride, or the like. In an embodiment, the hardener/crosslinker is an amine.

In an embodiment, the additive material is a catalyst. The specific catalyst that is employed depends upon compatibility with the underfill composition. Some catalysts for the above underfill compositions according to embodiments include imidizole and its derivatives, amines, triphenylphosphine, or the like. Other suitable examples include, methylene diamine, di-aminodiphenyl sulfone, or the like.

Another additive material according to an embodiment is a reactive diluent. The specific reactive diluent that is employed will depend upon compatibility with the underfill composition. Because of the bonding and sealing nature of the process embodiments, the reactive diluent reacts and/or dissolves into the final underfill mixture instead of volatilizes. Reactive diluents for the above underfill compositions according to embodiments include other low viscosity epoxy monomers such as Bi-phenyl epoxy, Bis-Phenol A epoxy, Bis-Phenol F epoxy, or the like. Other epoxies include phenyl glycidyl ethers, nonyl phenyl glycidyl ethers, p-butylphenyl glycidyl ethers, alkyl $C_8$-$C_{14}$ glycidyl ethers, cyclo aliphatic epoxies and the like.

Another additive material according to an embodiment is an adhesion promoter. The specific adhesion promoter that is employed depends upon compatibility with the underfill composition. Adhesion promoters that can be added to the above underfill compositions include organic and inorganic combinations. In an embodiment, a silane coupling agent or the like is used as an adhesion promoter. In an embodiment, an organo-ziconate composition or the like is used as an adhesion promoter. In an embodiment, an organo-titanate composition or the like is used as an adhesion promoter.

Another additive material according to an embodiment is a flow modifier such as a surfactant. The specific flow modifier that is employed depends upon compatibility with the underfill composition. The surfactant requires properties such as compatibility with the underfill composition. In an embodiment, the surfactant is anionic such as long chain alkyl carboxylic acids, such as lauric acids, steric acids, and the like. In an embodiment, the surfactant is nonionic. Examples of nonionic surfactants are polyethtlene oxides, poly propylene oxides, and the like. In an embodiment, the surfactant is cationic such as alkyl ammonium salts such as terta butyl ammonium chlorides, or hydroxides.

Another additive material according to an embodiment is a deforming agent. The specific deforming agent that is employed depends upon compatibility with the principal underfill composition. The deforming agent is also referred to as a plasticizer.

Another additive material according to an embodiment is a second fluxing agent. Second fluxing agents are mainly useful in no-flow underfill materials applications according to embodiments, including acids that can be dissolved in mixtures of the base resins and the cross-linking agents. One second fluxing agent type includes organic carboxylic acids and the like. Another second fluxing agent type includes polymeric fluxing agents and the like. The examples of second fluxing agents are any chemicals containing hydroxyl (—OH) group or carboxylic (—COOH) group or both, such as glycerin, ethylene glycol, tartaric acid, adipic acid, citric acid, malic acid, meilic acid, and glutaric acid.

Another additive material according to an embodiment is a toughening agent. A toughening agent causes the underfill composition to resist crack propagation. In an embodiment, an elastomer is used as the toughening agent. The specific elastomer that is employed to toughen the matrix depends upon compatibility with the underfill composition. For example, an elastomer that is used with epoxy-functionalized compositions is carboxy-terminated polybutadiene-acrylonitrile (CTBN). CTBN is the generic name for a family of elastomer additives for epoxies, with the primary elastomer being functionalized butadine-acrylonitrile copolymer. These elastomers are available as epoxy, carboxy, amino and vinyl terminal functionalities. Other elastomers may be used that are compatible with a given underfill composition.

Another additive material according to an embodiment is a inorganic particulate filler. Inorganic particulate fillers that optionally are added to the underfill mixtures include oxides of various elements such as silica, alumina, and others. Other inorganic particulate fillers include nitrides such as silicon nitride and the like. Other inorganic particulate fillers include conductive materials such as graphite, diamond, and the like. When an inorganic particulate filler is added, the underfill mixture is more appropriately referred to as an "underfill composite", in that it has inorganic particulate fillers as existing technology does, but it includes an underfill composition according to various embodiments. The underfill composite embodiments, unlike most other embodiments, include a more-than-one-phase substance.

EXAMPLE 1

In any of the first examples, the additives such as the crosslinker/hardener, flow modifier, etc., can be added according to a specific application.

In Example 1a, reference is made to FIGS. 1A-1C. After depositing the no-flow underfill composition, the flip-chip 110 is aligned with the mounting substrate 116 and the solder bump 112 is reflowed according to known technique. Thereafter, the underfill composition 121 is cured by thermal processing. The underfill composition 121 in this example includes the thermally cleavable compound (1) set forth above. The thermally cleavable compound (1) is present by original mixture weight, of about 5%. The underfill composition 121 also includes an epoxy as the thermosetting resin. Processing is carried out by thermally curing the underfill composition 121 at about 150° C.

In Example 1b, the same technique is followed as set forth in Example 1a. The underfill composition 121 in this example includes the thermally cleavable compound (1) set forth above. The thermally cleavable compound (1) is present by original mixture weight, of about 10%. The thermosetting resin acts as a matrix for the thermally cleavable compound, and the underfill composition also contains a hardener, an anhydride, and a phenolic.

In Example 1c, the same technique is followed as set forth in Example 1a. The underfill composition 121 in this example includes the thermally cleavable compound (1) set forth above. The thermally cleavable compound (1) is present by original mixture weight, of about 10%. The thermosetting resin includes an epoxy and a co-curing maleamide.

In Example 1d, the same technique is followed as set forth in Example 1a. The underfill composition 121 in this example includes the thermally cleavable compound (1) set forth above. The thermally cleavable compound (1) is present by original mixture weight, of about 10%. The thermosetting resin includes an epoxy and a co-curing cyanate ester.

In Example 1e, the same technique is followed as set forth in Example 1a. The underfill composition 121 in this example includes the thermally cleavable compound (1) set forth above. The thermally cleavable compound (1) is present by original mixture weight, of about 10%. The thermosetting resin includes an epoxy and a co-curing vinyl ether.

In Example 1f, the same technique is followed as set forth in Example 1a. The underfill composition 121 in this example includes the thermally cleavable compound (1) set forth above. The thermally cleavable compound (1) is present by original mixture weight, of about 10%. The underfill composition includes a maleamide thermosetting resin.

In Example 1g, the same technique is followed as set forth in Example 1a. The underfill composition 121 in this example includes the thermally cleavable compound (1) set forth above. The thermally cleavable compound (1) is present by original mixture weight, of about 10%. The underfill composition includes a cyanate ester thermosetting resin.

In Example 1h, the same technique is followed as set forth in Example 1a. The underfill composition 121 in this example includes the thermally cleavable compound (1) set forth above. The thermally cleavable compound (1) is present by original mixture weight, of about 10%. The underfill composition includes an ethynyl thermosetting resin.

In Example 1i, the same technique is followed as set forth in Example 1a. The underfill composition 121 in this example includes the thermally cleavable compound (1) set forth above. The thermally cleavable compound (1) is present by original mixture weight, of about 10%. The underfill composition includes a vinyl.

EXAMPLE 2

In any of the second examples, the additives such as the crosslinker/hardener, flow modifier, etc., can be added according to a specific application.

In Example 2a, reference is made to FIGS. 1A-1C. After depositing the no-flow underfill composition, the flip-chip 110 is aligned with the mounting substrate 116 and the solder bump 112 is reflowed according to known technique. Thereafter, the underfill composition 121 is cured by thermal processing. The underfill composition 121 in this example includes the thermally cleavable compound (2) set forth above. The thermally cleavable compound (2) is present by original mixture weight, of about 5%. The underfill composition 121 also includes an epoxy as the thermosetting resin. Processing is carried out by thermally curing the underfill composition 121 at about 150° C.

In Example 2b, the same technique is followed as set forth in Example 2a. The underfill composition 121 in this example includes the thermally cleavable compound (2) set forth above. The thermally cleavable compound (2) is present by original mixture weight, of about 10%. The thermosetting resin acts as a matrix for the thermally cleavable compound, and the underfill composition also contains a hardener, an anhydride, and a phenolic.

In Example 2c, the same technique is followed as set forth in Example 2a. The underfill composition 121 in this example includes the thermally cleavable compound (2) set forth above. The thermally cleavable compound (2) is present by original mixture weight, of about 10%. The thermosetting resin includes an epoxy and a co-curing maleamide.

In Example 2d, the same technique is followed as set forth in Example 2a. The underfill composition 121 in this example includes the thermally cleavable compound (2) set forth above. The thermally cleavable compound (2) is present by original mixture weight, of about 10%. The thermosetting resin includes an epoxy and a co-curing cyanate ester.

In Example 2e, the same technique is followed as set forth in Example 2a. The underfill composition 121 in this example includes the thermally cleavable compound (2) set forth above. The thermally cleavable compound (2) is present by original mixture weight, of about 10%. The thermosetting resin includes an epoxy and a co-curing vinyl ether.

In Example 2f, the same technique is followed as set forth in Example 2a. The underfill composition 121 in this example includes the thermally cleavable compound (2) set forth above. The thermally cleavable compound (2) is present by original mixture weight, of about 10%. The underfill composition includes a maleamide thermosetting resin.

In Example 2g, the same technique is followed as set forth in Example 2a. The underfill composition 121 in this example includes the thermally cleavable compound (2) set forth above. The thermally cleavable compound (2) is present by original mixture weight, of about 10%. The underfill composition includes a cyanate ester thermosetting resin.

In Example 2h, the same technique is followed as set forth in Example 2a. The underfill composition 121 in this example includes the thermally cleavable compound (2) set forth above. The thermally cleavable compound (2) is present by original mixture weight, of about 10%. The underfill composition includes an ethynyl thermosetting resin.

In Example 2i, the same technique is followed as set forth in Example 2a. The underfill composition 121 in this example includes the thermally cleavable compound (2) set forth above. The thermally cleavable compound (2) is present by original mixture weight, of about 10%. The underfill composition includes a vinyl.

EXAMPLE 3

In any of the third examples, the additives such as the crosslinker/hardener, flow modifier, etc., can be added according to a specific application.

In Example 3a, reference is made to FIGS. 1A-1C. After depositing the no-flow underfill composition, the flip-chip 110 is aligned with the mounting substrate 116 and the solder bump 112 is reflowed according to known technique. Thereafter, the underfill composition 121 is cured by thermal processing. The underfill composition 121 in this example includes the thermally cleavable compound (3) set forth above. The thermally cleavable compound (3) is present by original mixture weight, of about 5%. The underfill composition 121 also includes an epoxy as the thermosetting resin. Processing is carried out by thermally curing the underfill composition 121 at about 150° C.

In Example 3b, the same technique is followed as set forth in Example 3a. The underfill composition 121 in this example includes the thermally cleavable compound (3) set forth above. The thermally cleavable compound (3) is present by original mixture weight, of about 10%. The thermosetting resin acts as a matrix for the thermally cleavable compound, and the underfill composition also contains a hardener, an anhydride, and a phenolic.

In Example 3c, the same technique is followed as set forth in Example 3a. The underfill composition 121 in this example includes the thermally cleavable compound (3) set forth above. The thermally cleavable compound (3) is present by original mixture weight, of about 10%. The thermosetting resin includes an epoxy and a co-curing maleamide.

In Example 3d, the same technique is followed as set forth in Example 3a. The underfill composition 121 in this example includes the thermally cleavable compound (3) set forth above. The thermally cleavable compound (3) is present by original mixture weight, of about 10%. The thermosetting resin includes an epoxy and a co-curing cyanate ester.

In Example 3e, the same technique is followed as set forth in Example 3a. The underfill composition 121 in this example includes the thermally cleavable compound (3) set forth above. The thermally cleavable compound (3) is present by original mixture weight, of about 10%. The thermosetting resin includes an epoxy and a co-curing vinyl ether.

In Example 3f, the same technique is followed as set forth in Example 3a. The underfill composition 121 in this example includes the thermally cleavable compound (3) set forth above. The thermally cleavable compound (3) is present by original mixture weight, of about 10%. The underfill composition includes a maleamide thermosetting resin.

In Example 3g, the same technique is followed as set forth in Example 3a. The underfill composition 121 in this example includes the thermally cleavable compound (3) set forth above. The thermally cleavable compound (3) is present by original mixture weight, of about 10%. The underfill composition includes a cyanate ester thermosetting resin.

In Example 3h, the same technique is followed as set forth in Example 3a. The underfill composition 121 in this example includes the thermally cleavable compound (3) set forth above. The thermally cleavable compound (3) is present by original mixture weight, of about 10%. The underfill composition includes an ethynyl thermosetting resin.

In Example 3i, the same technique is followed as set forth in Example 3a. The underfill composition 121 in this example includes the thermally cleavable compound (3) set forth above. The thermally cleavable compound (3) is present by original mixture weight, of about 10%. The underfill composition includes a vinyl.

EXAMPLE 4

In any of the fourth examples, the additives such as the crosslinker/hardener, flow modifier, etc., can be added according to a specific application.

In Example 4a, reference is made to FIGS. 1A-1C. After depositing the no-flow underfill composition, the flip-chip 110 is aligned with the mounting substrate 116 and the solder bump 112 is reflowed according to known technique. Thereafter, the underfill composition 121 is cured by thermal processing. The underfill composition 121 in this example includes the thermally cleavable compound (4) set forth above. The thermally cleavable compound (4) is present by original mixture weight, of about 5%. The underfill composition 121 also includes an epoxy as the thermosetting resin. Processing is carried out by thermally curing the underfill composition 121 at about 150° C.

In Example 4b, the same technique is followed as set forth in Example 4a. The underfill composition 121 in this example includes the thermally cleavable compound (4) set forth above. The thermally cleavable compound (4) is present by original mixture weight, of about 10%. The thermosetting resin acts as a matrix for the thermally cleavable compound, and the underfill composition also contains a hardener, an anhydride, and a phenolic.

In Example 4c, the same technique is followed as set forth in Example 4a. The underfill composition 121 in this example includes the thermally cleavable compound (4) set forth above. The thermally cleavable compound (4) is present by original mixture weight, of about 10%. The thermosetting resin includes an epoxy and a co-curing maleamide.

In Example 4d, the same technique is followed as set forth in Example 4a. The underfill composition 121 in this example includes the thermally cleavable compound (4) set forth above. The thermally cleavable compound (4) is present by original mixture weight, of about 10%. The thermosetting resin includes an epoxy and a co-curing cyanate ester.

In Example 4e, the same technique is followed as set forth in Example 4a. The underfill composition 121 in this example includes the thermally cleavable compound (4) set forth above. The thermally cleavable compound (4) is present by original mixture weight, of about 10%. The thermosetting resin includes an epoxy and a co-curing vinyl ether.

In Example 4f, the same technique is followed as set forth in Example 4a. The underfill composition 121 in this example includes the thermally cleavable compound (4) set forth above. The thermally cleavable compound (4) is present by original mixture weight, of about 10%. The underfill composition includes a maleamide thermosetting resin.

In Example 4g, the same technique is followed as set forth in Example 4a. The underfill composition 121 in this example includes the thermally cleavable compound (4) set forth above. The thermally cleavable compound (4) is present by original mixture weight, of about 10%. The underfill composition includes a cyanate ester thermosetting resin.

In Example 4h, the same technique is followed as set forth in Example 4a. The underfill composition 121 in this example includes the thermally cleavable compound (4) set forth above. The thermally cleavable compound (4) is present by original mixture weight, of about 10%. The underfill composition includes an ethynyl thermosetting resin.

In Example 4i, the same technique is followed as set forth in Example 4a. The underfill composition 121 in this example includes the thermally cleavable compound (4) set forth above. The thermally cleavable compound (4) is present by original mixture weight, of about 10%. The underfill composition includes a vinyl.

EXAMPLE 5

In any of the fifth examples, the additives such as the crosslinker/hardener, flow modifier, etc., can be added according to a specific application.

In Example 5a, reference is made to FIGS. 1A-1C. After depositing the no-flow underfill composition, the flip-chip 110 is aligned with the mounting substrate 116 and the solder bump 112 is reflowed according to known technique. Thereafter, the underfill composition 121 is cured by thermal processing. The underfill composition 121 in this example includes the thermally cleavable compound (5) set forth above. The thermally cleavable compound (5) is present by original mixture weight, of about 5%. The underfill composition 121 also includes an epoxy as the thermosetting resin. Processing is carried out by thermally curing the underfill composition 121 at about 150° C.

In Example 5b, the same technique is followed as set forth in Example 5a. The underfill composition 121 in this example includes the thermally cleavable compound (5) set forth above. The thermally cleavable compound (5) is present by original mixture weight, of about 10%. The thermosetting resin acts as a matrix for the thermally cleavable compound, and the underfill composition also contains a hardener, an anhydride, and a phenolic.

In Example 5c, the same technique is followed as set forth in Example 5a. The underfill composition 121 in this example includes the thermally cleavable compound (5) set forth above. The thermally cleavable compound (5) is present by original mixture weight, of about 10%. The thermosetting resin includes an epoxy and a co-curing maleamide.

In Example 5d, the same technique is followed as set forth in Example 5a. The underfill composition 121 in this example includes the thermally cleavable compound (5) set forth above. The thermally cleavable compound (5) is present by original mixture weight, of about 10%. The thermosetting resin includes an epoxy and a co-curing cyanate ester.

In Example 5e, the same technique is followed as set forth in Example 5a. The underfill composition 121 in this example includes the thermally cleavable compound (5) set forth above. The thermally cleavable compound (5) is present by original mixture weight, of about 10%. The thermosetting resin includes an epoxy and a co-curing vinyl ether.

In Example 5f, the same technique is followed as set forth in Example 5a. The underfill composition 121 in this example includes the thermally cleavable compound (5) set forth above. The thermally cleavable compound (5) is present by original mixture weight, of about 10%. The underfill composition includes a maleamide thermosetting resin.

In Example 5g, the same technique is followed as set forth in Example 5a. The underfill composition 121 in this example includes the thermally cleavable compound (5) set forth above. The thermally cleavable compound (5) is present by original mixture weight, of about 10%. The underfill composition includes a cyanate ester thermosetting resin.

In Example 5h, the same technique is followed as set forth in Example 5a. The underfill composition 121 in this example includes the thermally cleavable compound (5) set forth above. The thermally cleavable compound (5) is present by original mixture weight, of about 10%. The underfill composition includes an ethynyl thermosetting resin.

In Example 5i, the same technique is followed as set forth in Example 5a. The underfill composition 121 in this example includes the thermally cleavable compound (5) set forth above. The thermally cleavable compound (5) is present by original mixture weight, of about 10%. The underfill composition includes a vinyl.

FIG. 2A is a cross-section of a package 200 during processing according to an embodiment. The package 200 includes a flip-chip 210 and a solder bump 212 that is attached to the flip-chip 210. Electrical coupling for the flip-chip 210 is accomplished through a die bond pad 214 that is landed on the flip-chip 210. The flip-chip 210 is disposed on a mounting substrate 216. The mounting substrate 216 is part of an interposer. In an embodiment, the mounting substrate 216 is part of a small PWB such as a board for a handheld device such as a cell phone or a PDA.

FIG. 2A also depicts an underfill composition 120 that has acted to encapsulate the die bond pad 214. In an embodiment, the underfill compositon 120 includes a thermosetting resin and a thermally cleavable compound that releases sulfonic acid, according to any of the embodiments set forth in this disclosure.

In FIG. 2A, the mounting substrate 216 depicted being brought near a board 222, which will be coupled to the mounting substrate 216 through a solder second bump 224. The solder second bump is depicted as about to penetrate a stress-compensation collar (SCC) precursor 226. In an embodiment, the SCC precursor 226 includes a thermosetting resin and a thermally cleavable compound that releases sulfonic acid, according to any of the embodiments set forth in this disclosure.

In an embodiment, the mounting substrate 216 includes a stress-relief layer (SRL) 228 that is in contact with the solder second bump 224. In an embodiment, the SRL 228 includes a thermosetting resin and a thermally cleavable compound that releases sulfonic acid, according to any of the embodiments set forth in this disclosure.

In an embodiment, the board 222 is prepared with a substantially particle-free SCC 230, through which the solder second bump 224 passes upon mating the solder second bump 224 with the board 222. In an embodiment, the particle-free SCC 230 acts in concert with a SCC precursor 226 that includes up to about 50% or more particulate filler. The particle-free SCC 230 acts as a particle deflector during mating of the board 222 with the solder second bump 222.

FIG. 2B is a cross-section of the package depicted in FIG. 2A after further processing according to an embodiment. The package 201 is depicted after full assembly and curing of the various layers and after reflow of the various solder bumps. In an embodiment, curing is followed by reflowing of any of the solder bumps onto the various substrate bond pads. In an embodiment, curing and reflowing are carried out substantially simultaneously. In an embodiment, curing is carried out by various processing paths including autocatalytic, additive catalytic, diluent cross-linking/hardening, thermoset, and a combination thereof.

Figure 3:
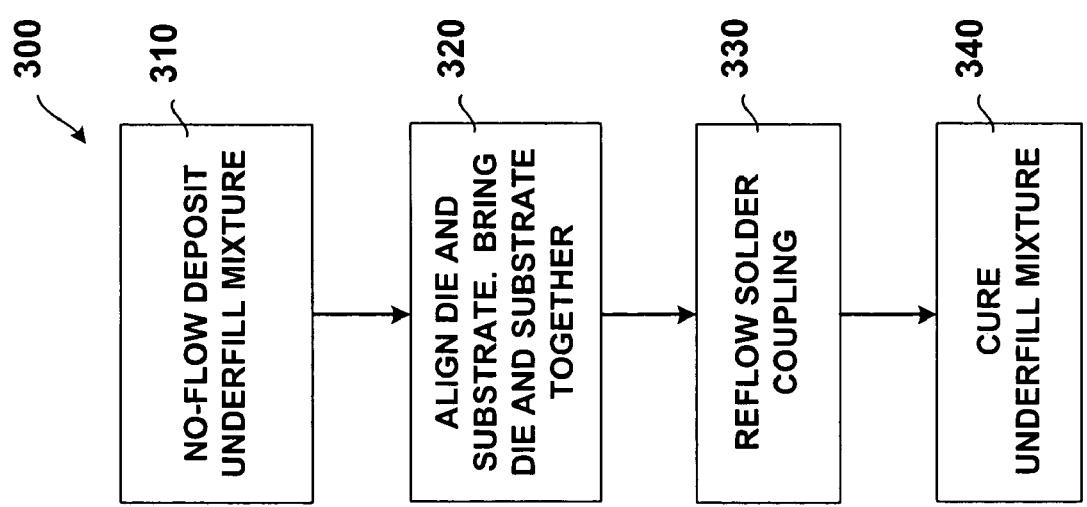
FIG. 3 is a process flow diagram according to an embodiment.

FIG. 3 is a process flow diagram 300 according to an embodiment.

At 310, the process includes no-flow depositing an underfill mixture onto a substrate. According to the various embodiments, the substrate can be any of the die, the mounting substrate, and/or the board.

At 320, the process includes aligning the die and the mounting substrate and bringing them together. According to an embodiment, the process can include aligning the mounting substrate and the board and bring them together by allowing the solder second bump to penetrate an SCC precursor.

At 330, the process includes reflowing the solder bump. The process can also include thermal activation and cleavage of the sulfonic acid-containing constituent in the underfill composition. According to an embodiment, the process includes reflowing the solder first bump against the mounting substrate. According to an embodiment, the process includes reflowing the solder second bump against the board. According to an embodiment, the process includes reflowing the solder first bump against the mounting substrate, and the solder second bump against the board.

At 340, the process includes curing the underfill mixture.

Figure 4:
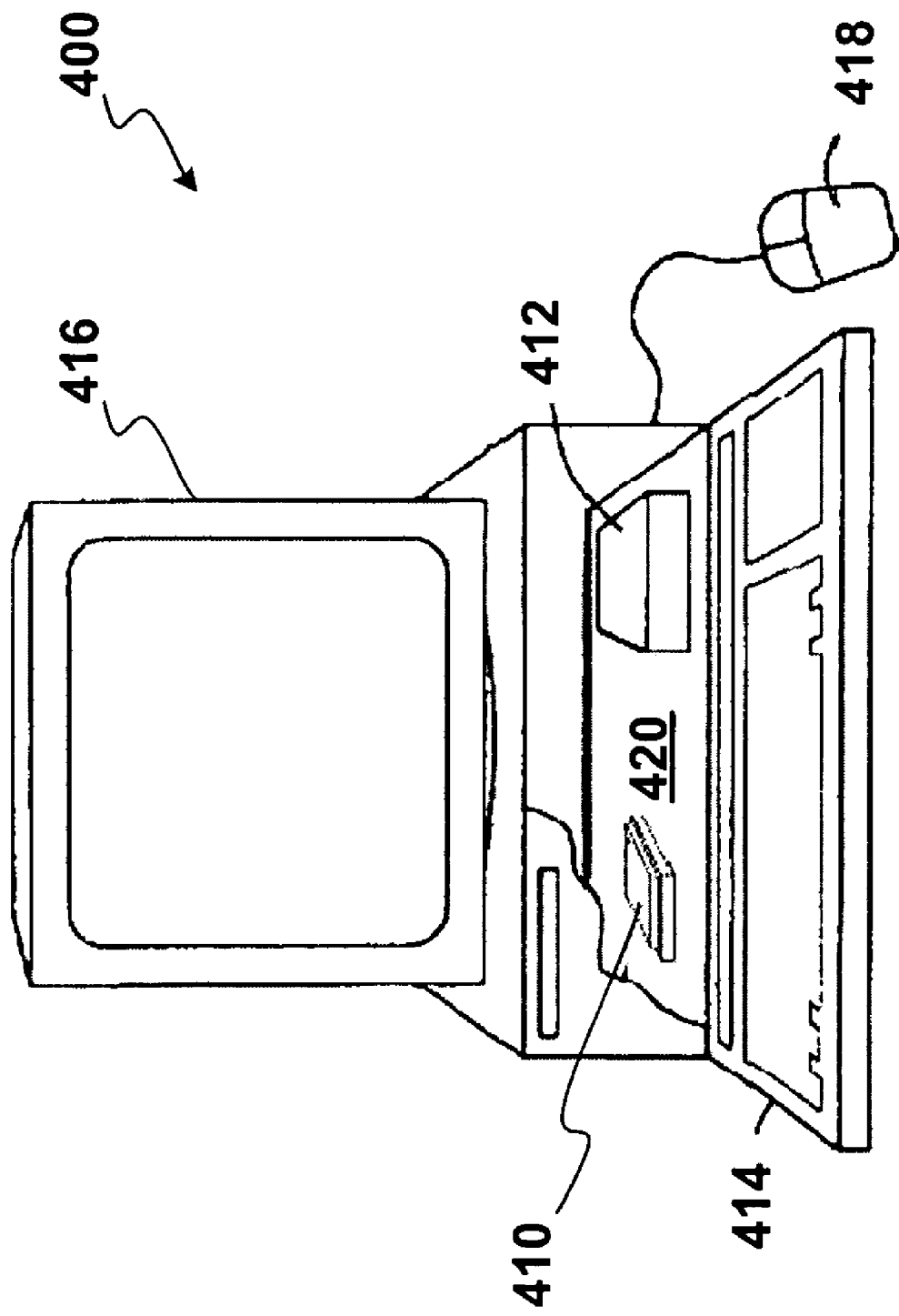
FIG. 4 is a depiction of a computing system according to an embodiment.

FIG. 4 is a depiction of a computing system 400 according to an embodiment. One or more of the foregoing embodiments of a sulfonic acid residue-containing underfill composition and/or composite may be utilized in a computing system, such as a computing system 400 of FIG. 4. The computing system 400 includes at least one processor (not pictured), which is enclosed in a package 410, a data storage system 412, at least one input device such as keyboard 414, and at least one output device such as monitor 416, for example. The computing system 400 includes a processor that processes data signals, and may include, for example, a microprocessor, available from Intel Corporation. In addition to the keyboard 414, the computing system 400 can include another user input device such as a mouse 418, for example.

For purposes of this disclosure, a computing system 400 embodying components in accordance with the claimed subject matter may include any system that utilizes a sulfonic acid residue-containing underfill composition and/or composite, which may be coupled to a mounting substrate 420, for example, for a data storage device such as dynamic random access memory, polymer memory, flash memory, and phase-change memory. The imprinted sulfonic acid residue-containing underfill composition and/or composite can also be coupled to a mounting substrate 420 for a die that contains a digital signal processor (DSP), a micro-controller, an application specific integrated circuit (ASIC), or a microprocessor.

Embodiments set forth in this disclosure can be applied to devices and apparatuses other than a traditional computer. For example, a die can be packaged with an embodiment of the sulfonic acid residue-containing underfill composition and/or composite and placed in a portable device such as a wireless communicator or a hand-held such as a personal digital assistant and the like. Another example is a die that can be packaged with a sulfonic acid residue-containing underfill composition and/or composite and placed in a vehicle such as an automobile, a locomotive, a watercraft, an aircraft, or a spacecraft.

The Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An underfill composition comprising:
   a thermally cleavable compound that releases sulfonic acid, wherein the thermally cleavable compound represents from about 1% to about 20% by weight of the underfill composition upon preparation; and
   a thermosetting resin, wherein the thermosetting resin includes:
   an epoxy including greater than about 50% by weight of the underfill composition upon preparation; and further including at least one of
   a hardener;
   an anhydride;
   a phenolic;
   an amine; and
   the solution, reaction, and mixture products of the underfill composition.

2. The underfill composition of claim 1, wherein the thermosetting resin includes:
   an epoxy and at least one of a co-curing compound selected from
   a maleamide;
   a cyanate ester;
   a vinyl ether and
   the solution, reaction, and mixture products of the underfill composition.

3. The underfill composition of claim 1, wherein the underfill composition is an underfill composite including an inorganic particulate filler, present up to about 75% by weight of the underfill composite.

4. The underfill composition of claim 1, further including at least one additive material selected from:
   a catalyst; an adhesion promoter; an elastomer; a filler particulate; a diluent; a hardener/crosslinker; a surfactant; a deforming agent; and a toughening agent.

* * * * *